United States Patent

La Branche et al.

[15] 3,694,660

[45] Sept. 26, 1972

[54] RADIATION SENSITIVE READOUT HEAD WITH CIRCUIT BOARD CONSTRUCTION

[72] Inventors: Harvey W. La Branche, Palos Verdes Peninsula; John H. Northrop, La Canada, both of Calif.

[73] Assignee: Mattel, Inc., Hawthorne, Calif.

[22] Filed: Jan. 12, 1971

[21] Appl. No.: 105,889

[52] U.S. Cl. ..................250/239, 250/219 D, 29/625

[51] Int. Cl. ................................................H01l 15/00

[58] Field of Search ...250/219 D, 219 DC, 239, 208, 250/209, 220 M, 211 R

[56] References Cited

UNITED STATES PATENTS

| | | | |
|---|---|---|---|
| 3,136,894 | 6/1964 | Reimer | 250/239 X |
| 3,082,327 | 3/1963 | Rice | 250/220 M |
| 3,097,302 | 7/1963 | Wayne et al. | 250/208 |
| 3,424,879 | 1/1969 | Shlesinger, Jr. | 250/219 X D |
| 3,467,820 | 9/1969 | Droege et al. | 250/219 X DC |
| 3,475,713 | 10/1969 | Joorman et al. | 250/219 X DC |

*Primary Examiner*—Walter Stolwein
*Attorney*—Seymour A. Scholnick

[57] ABSTRACT

A connector which includes a circuit board wherein the conductive strips thereof are formed of a resilient conductive material and their ends extend past the edges of the supporting board. The circuit board is mounted in a housing which has a plug-receiving recess, and the projecting strips at one end of the circuit board extend into the recess, so that another circuit board can be plugged into the recess to establish contact between the strips of the two circuit boards. The housing can be part of an optical readout head, and the projecting ends of the circuit board which lie opposite those in the plug-receiving recess can support and contact photocells. The circuit board with projecting strips is constructed by adhesively fastening a conductive sheet to an insulative board of smaller length, applying an acid resist in strips to the completely exposed face of the sheet and a continuous coating to the exposed ends of the other face, and etching away the resist-free strips.

2 Claims, 9 Drawing Figures

INVENTORS
HARVEY W. LA BRANCHE
JOHN H. NORTHROP
BY
Gerald L. Price
ATTORNEY

HARVEY W. LA BRANCHE
JOHN H. NORTHROP
INVENTORS
BY [signature]
ATTORNEYS

RADIATION SENSITIVE READOUT HEAD WITH CIRCUIT BOARD CONSTRUCTION

BACKGROUND OF THE INVENTION

1. Field of the Invention:

This invention relates to connectors and to methods for constructing them.

2. Description of the Prior Art:

Connectors with multiple contacts are typically constructed using a housing that has numerous slots and numerous independent strips of conductive material which are held in the slots. The housing may define a plug-receiving recess, and the ends of the conductive strips are bent to extend into the recess so that the strips engage contacts of a plug that is inserted therein. A large portion of the connector cost is attributable to the fact that numerous separate conductive strips must be bent to close tolerances and individually placed in the slots during assembly. A connector which eliminated much of the handling of individual conductive strips, both in bending and in their mounting in the connector, would enable connectors with numerous contacts to be constructed at lower cost.

OBJECTS AND SUMMARY OF THE INVENTION

An object of the present invention is to provide a connector which is very economical and rugged.

Another object is to provide a method for constructing an economical connector.

In accordance with one embodiment of the present invention, a connector is provided which includes a circuit board with numerous parallel conductive strips that have end portions which extend past the edges of the insulative board. The circuit board is held in a housing which has a plug-receiving recess. The conductive strips of the circuit board are constructed of a resilient material and they are bent to project into the recess. Thus, when a plug with many strips on it is inserted, contact is made between the strips of the plug and circuit board. The connector can be utilized in an optical readout head by mounting photocells on the ends of the conductive strips opposite those in the plug-receiving recess, that project past another edge of the board.

The circuit board with projecting conductive strips is constructed by utilizing a sheet of resilient and electrically conductive material such as beryllium copper. The sheet is adhesively joined facewise to an insulating board which is shorter than the sheet, so that end portions of the sheet project past the edges of the board. An acid resist is applied to a first face of the sheet which lies opposite the board to define strips thereon, and the resist is also applied to the exposed end portion of the second face of the sheet. The sheet and board assembly is then dipped into an acid bath to leave only numerous strip portions thereon. The projecting end portions of the strips can then be bent as a unit and installed as a unit (which is part of the circuit board) into a connector housing.

The novel features of the invention are set forth with particularlity in the appended claims. The invention will be best understood from the following description when read in conjunction with the accompanying drawings.

DESCRIPTION OF THE PREFERRED EMBODIMENTS

Figure 2:
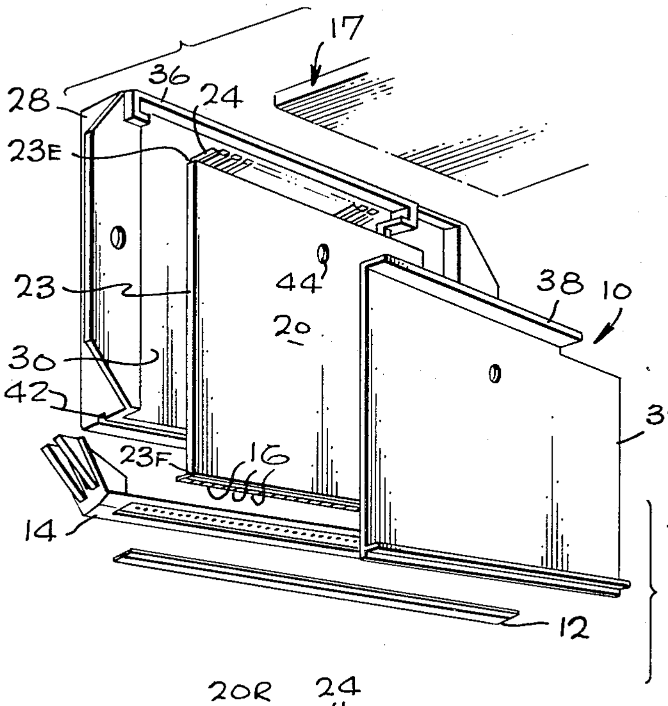
FIG. 2 is a perspective exploded view of the apparatus of FIG. 1.

FIG. 2 illustrates an optical readout head and connector assembly 10 which is used in an electronic organ wherein sounds are recorded on numerous concentric tracks of a rotating optical disc. Light shining through the numerous tracks passes through a slit member 12 and a collimator 14 and onto numerous photocells 16. The head may contain several dozen photocells, which are connected through a corresponding number of piano-like keys that couple the photocell outputs to an amplifier and loudspeaker. In order to facilitate manufacturing of the head assembly 10, it is constructed so that it can be readily mounted as a unit in the organ and can be electrically connected into the organ by inserting a plug 17 into a recess 18 formed in the unit. The plug 17 is provided with many conductive strips thereon which, when the plug is inserted into the recess, must make electrical connection simultaneously with the numerous photocells 16. It can be appreciated that many individual conductive elements must be employed to connect the plug to the photocells, and that if each of such elements had to be formed and installed separately, this would add appreciable cost to the head.

In accordance with the invention, the head assembly 10 includes a circuit board assembly 20 which has numerous conductive strips 22 that are rigidly fixed to a plate or board 23 of insulating material. The conductive strips 22 have center portions fixed to the supporting board 23 and opposite end portions 24 and 26 which project beyond the edges 23E and 23F of the board. One edge 23E of the board extends adjacent to and parallel with the recess 18. One end 24 of each strip, which extends past the board end 23E, projects into the recess 18 to contact a plug connector when it is received in the recess. The other end 26 of each strip supports and contacts one terminal of a photocell 16. The fact that all of the strips are fastened to one board 23 enables their projecting end portions to be bent to the proper shape all at one time and to be mounted in place as a unit, thereby eliminating considerable assembling expense.

Figures 3, 6:
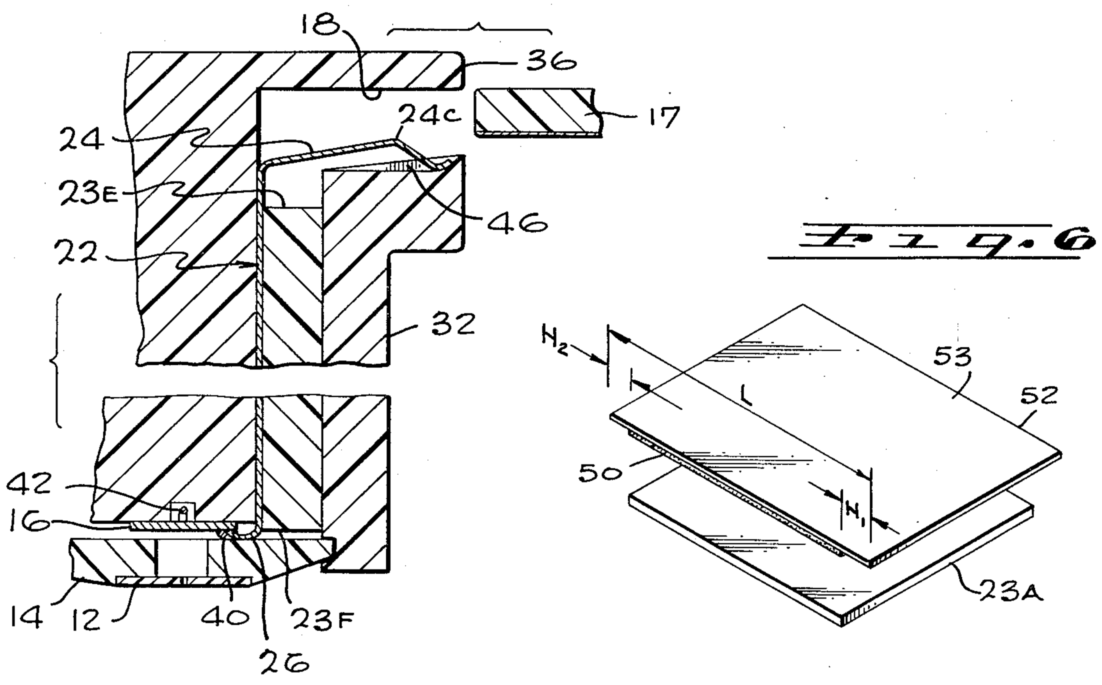
FIG. 3 is an enlarged partial view taken on the line 3—3 of FIG. 1, and showing the manner in which a plug is received.
FIGS. 6–9 illustrate steps in the process of constructing the circuit board of the apparatus of FIG. 1.
Figure 7:
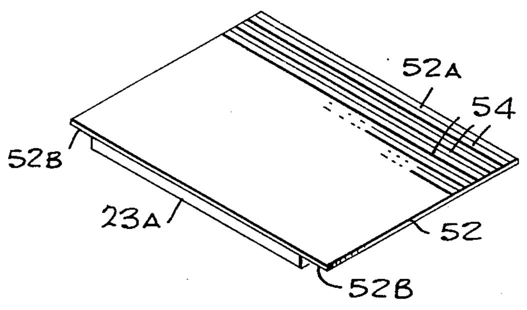
Figure 8:
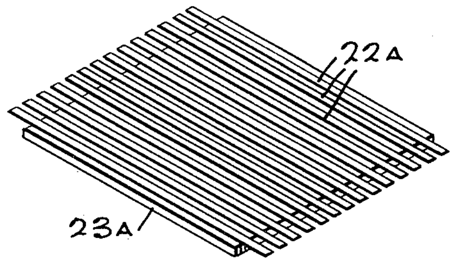
Figure 9:
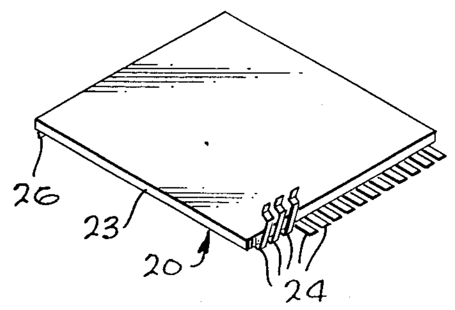

The head assembly 10 includes a first housing member 28 with a board supporting surface 30 that is designed to receive the circuit board assembly 20 facewise thereon. A second housing member 32 is provided for laying facewise against the circuit board assembly 20 to hold it against the other housing member 28. A screw 34 projects through holes in the housing members and circuit board assembly for secure fastening. The first housing member 28 has a flange 36 that projects from the surface 30, while the other housing member 32 has a corresponding flange 38, the two flanges 36, 38 defining the plug-receiving recess 18. The circuit board assembly 20 is installed with the side containing the conductive strips 22 against the surface 30. The projecting strip ends 24 extend substantially perpendicular to the faces of the board 23 into the recess 18. The ends 24 are bent so that a curved portion 24C (FIG. 3) is the highest portion in the recess and first contacts conductors of the plug 17. The other projecting ends 26 of the conductive strips are held by solder joints 40 to terminals on the photoconductors 16 for electrical connection to the photocells and to mechanically support the photocells. Another terminal of the photocells is contacted by a sinuously bent wire 42 that extends along them.

Figure 1:
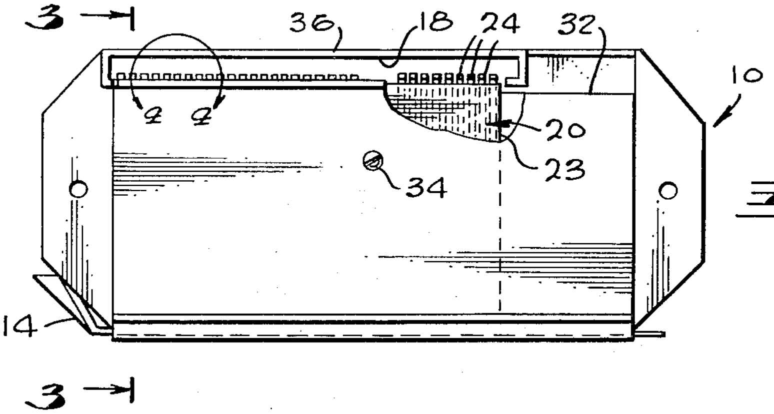
FIG. 1 is a front elevation view of an optical readout head and connector constructed in accordance with one embodiment of the invention.
Figure 4:
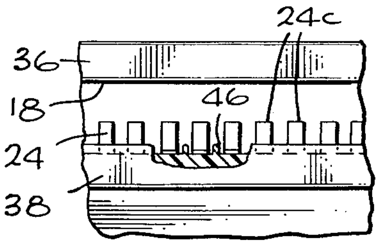
FIG. 4 is an enlarged view of the area 4—4 of FIG. 1.
Figure 5:
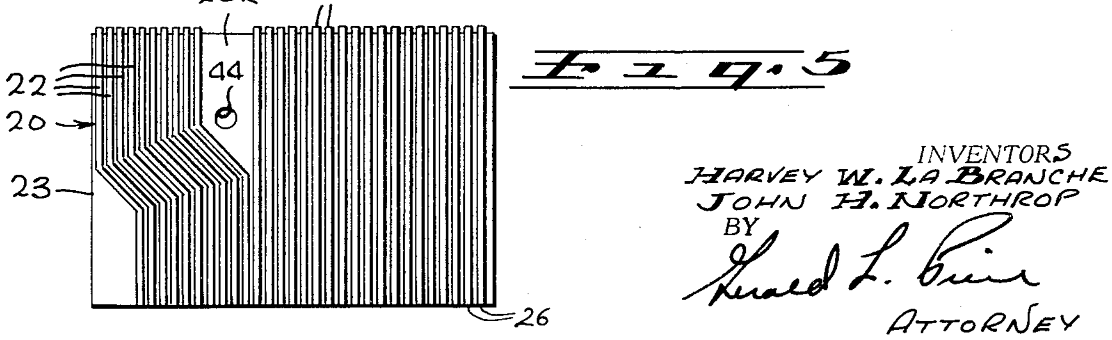
FIG. 5 is a rear view of the circuit board of the apparatus of FIG. 1.

FIG. 5 illustrates the rear face 20R of the circuit board, on which the conductive strips 22 are mounted. The strips are spaced slightly from one another and are generally parallel to each other, although one group has an angled region to pass around a hole 44 where the mounting screw is inserted. The conductive strips 22 are rigidly held in place to the underlying board 23, although the ends 24 and 26 which extend beyond corresponding edges of the board can deflect. It is desirable to provide additional spacers to prevent the projecting ends 26 from contacting one another, inasmuch as they are long and may be deflected many times during installation and removal of a plug. Accordingly, the flange 38 on the second housing member 32 is provided with separator portions 46 (FIG. 4) between the locations where the conductive strips end portions are received.

The circuit board assembly 20 can be constructed in the manner illustrated in FIGS. 6–9, which is similar to the construction of ordinary circuit boards except for certain important differences. The assembly is constructed by applying a coating of adhesive 50 on a thin sheet 52 of electrically conductive material 53. The sheet 52 is also preferably highly resilient, and a material such as phosphor bronze or berrylium copper can be employed. The sheet 52 with adhesive thereon is then pressed against a board 23A of insulative material such as fiberglass. The electrically conductive sheet has a length L which is greater than the length of the board 23A so that there is a length of overhang $H_1$ and $H_2$ at either end. The adhesive 50 is applied only to the portion of the conductive sheet that will contact the circuit board.

After the sheet 52 of conductive material is adhesively affixed to the board, the face 52A opposite the board is coated with strips 54 of resist material such as a resin, which resists etching by acid. The other face 52B of the conductive sheet is also coated with resist at the end portions thereof which overhang the board 23A. The resist on the underface 52B does not have to be applied in strips, but can be a continuous coating. The entire assembly is then dipped in an acid bath for a period sufficient to allow etching away of those portions of the conductive sheet 52 which are not covered by resist. When the assembly is withdrawn from the acid bath, the resist strips 54 can be removed, and an assembly of the type shown in FIG. 8 results, which includes the board 23A with numerous conductive strips 22A thereon, each strip having end portions extending beyond the edges of the board. The projecting end portions can be bent in any desired manner, such as that shown in FIG. 9, to create a circuit board assembly of the type shown at 20. Inasmuch as all of the conductive strips have ends 24 which are bent identically and ends 26 which are bent identically, the bending of all ends 24 can be performed simultaneously on a bending jig, and bending of all of the ends 26 can be performed simultaneously on another jig. Such bending is easily accomplished because the entire assembly can be mounted as a unit on the jig, and once bending is accomplished there is assurance that all of the conductive strips will remain in the same relative positions.

Another method which can be employed includes attaching a sheet of resilient electrically conductive material to a backing sheet of material which is not affected by an etching solution, coating the conductive sheet with strips of resist, and dipping the assembly into an etching bath. The backing sheet will then hold strips of the conductive material. The strips, while still held on the backing sheet, are adhesively attached to a board. The backing sheet is then trimmed sufficiently to leave the conductive strip portions which overhang the board free to bend independently of one another.

Thus, the invention provides a connector assembly with numerous contacts, that can be produced at relatively low cost, by providing a circuit board assembly with conductive strips that have end portions extending beyond the edges of the underlying board. The conductive strips are preferably constructed of a conductive material that is resilient, so that the end portions can be received in a plug-receiving recess, and can deflect to assure good contact with corresponding conductive members of the plug. The connector assembly can be used in a variety of installations, and is especially useful in an optical read head, wherein one end of each conductive strip supports and is electrically conducted to a different photocell. The circuit board assembly with conductive strips that project beyond the board can be constructed in much the same way as circuit boards, although the conductive sheet is preferably of resilient material, it overhangs the board, and the back of the overhanging portion is covered with a resist to protect it from the etching solution.

Although particular embodiments of the invention have been described and illustrated herein, it is recognized that modifications and variations may readily occur to those skilled in the art and, consequently, it is intended that the claims be interpreted to cover such modifications and equivalents.

What is claimed is:

1. An optical readout head comprising:

a housing;

a circuit board mounted on said housing, said circuit board having a plate of electrically insulative material and a plurality of strips of electrically conductive material, said strips having center portions adhesively fixed to said plate and a first end portions which extend beyond an edge of said plate;

a plurality of photocells in said housing, each having a first terminal portion fixed to the first end of a different one of said strips, and a second terminal;

conductor means contacting said second terminals of said photocells;

and slit means in said housing directing light onto said photocells.

2. The head described in claim 1 wherein:

said housing defines a plug-receiving recess; and said strips have second end portions opposite said first end portions, said second end portions extending past another edge of said plate and into said plug-receiving recess and having their end portions exposed therein for releasable engagement by terminals on a plug.

* * * * *